United States Patent
Fukuhara et al.

(10) Patent No.: US 8,778,572 B2
(45) Date of Patent: Jul. 15, 2014

(54) PHOTOMASK AND PATTERN FORMING METHOD

(75) Inventors: Kazuya Fukuhara, Tokyo (JP); Shingo Kanamitsu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 61 days.

(21) Appl. No.: 13/599,152

(22) Filed: Aug. 30, 2012

(65) Prior Publication Data

US 2013/0244141 A1    Sep. 19, 2013

(30) Foreign Application Priority Data

Mar. 16, 2012    (JP) ................. 2012-059983

(51) Int. Cl.
*G03F 1/32*    (2012.01)

(52) U.S. Cl.
USPC .............................................. 430/5

(58) Field of Classification Search
USPC ...................... 430/5, 322, 323, 394
See application file for complete search history.

(56) References Cited

U.S. PATENT DOCUMENTS

| | | | |
|---|---|---|---|
| 5,300,786 A | 4/1994 | Brunner et al. | |
| 5,770,338 A | 6/1998 | Lim et al. | |
| 5,948,571 A | 9/1999 | Mih et al. | |
| 6,114,096 A | 9/2000 | Mih et al. | |
| 6,440,616 B1 | 8/2002 | Izuha et al. | |
| 6,674,511 B2 | 1/2004 | Nomura et al. | |
| 6,844,918 B2 | 1/2005 | Navarro et al. | |
| 6,884,552 B2 | 4/2005 | Mieher et al. | |
| 7,112,813 B2 | 9/2006 | Den Boef et al. | |
| 7,175,945 B2 | 2/2007 | Mieher et al. | |
| 7,297,971 B2 | 11/2007 | Van Bilsen et al. | |
| 7,329,888 B2 | 2/2008 | Van Bilsen et al. | |
| 7,330,261 B2 | 2/2008 | Van Haren et al. | |
| 7,332,732 B2 | 2/2008 | Van Bilsen et al. | |
| 7,371,483 B2 | 5/2008 | Kanamitsu et al. | |
| 7,432,021 B2 | 10/2008 | Sato et al. | |
| 7,439,531 B2 | 10/2008 | Van Bilsen et al. | |
| 7,619,738 B2 | 11/2009 | Van Haren et al. | |
| 7,657,152 B2 | 2/2010 | Koudo et al. | |
| 7,678,516 B2 | 3/2010 | Monahan et al. | |
| 7,880,880 B2 | 2/2011 | Van Bilsen et al. | |
| 8,139,217 B2 | 3/2012 | Van Bilsen et al. | |
| 2005/0202323 A1* | 9/2005 | Watanabe | 430/5 |
| 2006/0081790 A1 | 4/2006 | Van Bilsen et al. | |
| 2006/0081791 A1 | 4/2006 | Van Bilsen et al. | |
| 2009/0190118 A1 | 7/2009 | Fukuhara | |

FOREIGN PATENT DOCUMENTS

| | | |
|---|---|---|
| JP | 2539163 B3 | 7/1996 |
| JP | 2953406 B2 | 7/1999 |
| JP | 2980580 B2 | 9/1999 |
| JP | 3052064 B2 | 4/2000 |
| JP | 2000-252199 | 9/2000 |

(Continued)

*Primary Examiner* — Stephen Rosasco

(74) *Attorney, Agent, or Firm* — Finnegan, Henderson, Farabow, Garrett & Dunner, L.L.P.

(57) ABSTRACT

According to one embodiment, a photomask includes a mask substrate transparent to light, a light shielding pattern formed on the mask substrate, and a thin film portion that is provided at a part of the light shielding pattern and is thinned to have a higher light transmittance than the light shielding pattern, in which the thin film portion is arranged with respect to a light shielding pattern that is sensitive to a focus shift so that a sensitivity becomes stable and is not arranged with respect to a light shielding pattern whose sensitivity to a focus shift is stable.

19 Claims, 9 Drawing Sheets

(56) References Cited

FOREIGN PATENT DOCUMENTS

| | | |
|---|---|---|
| JP | 2001-22048 | 1/2001 |
| JP | 3778170 B2 | 3/2006 |
| JP | 3848037 B2 | 9/2006 |
| JP | 4009219 B2 | 9/2007 |
| JP | 4222926 B2 | 11/2008 |
| JP | 4726935 B2 | 4/2011 |
| JP | 4748936 | 5/2011 |

* cited by examiner

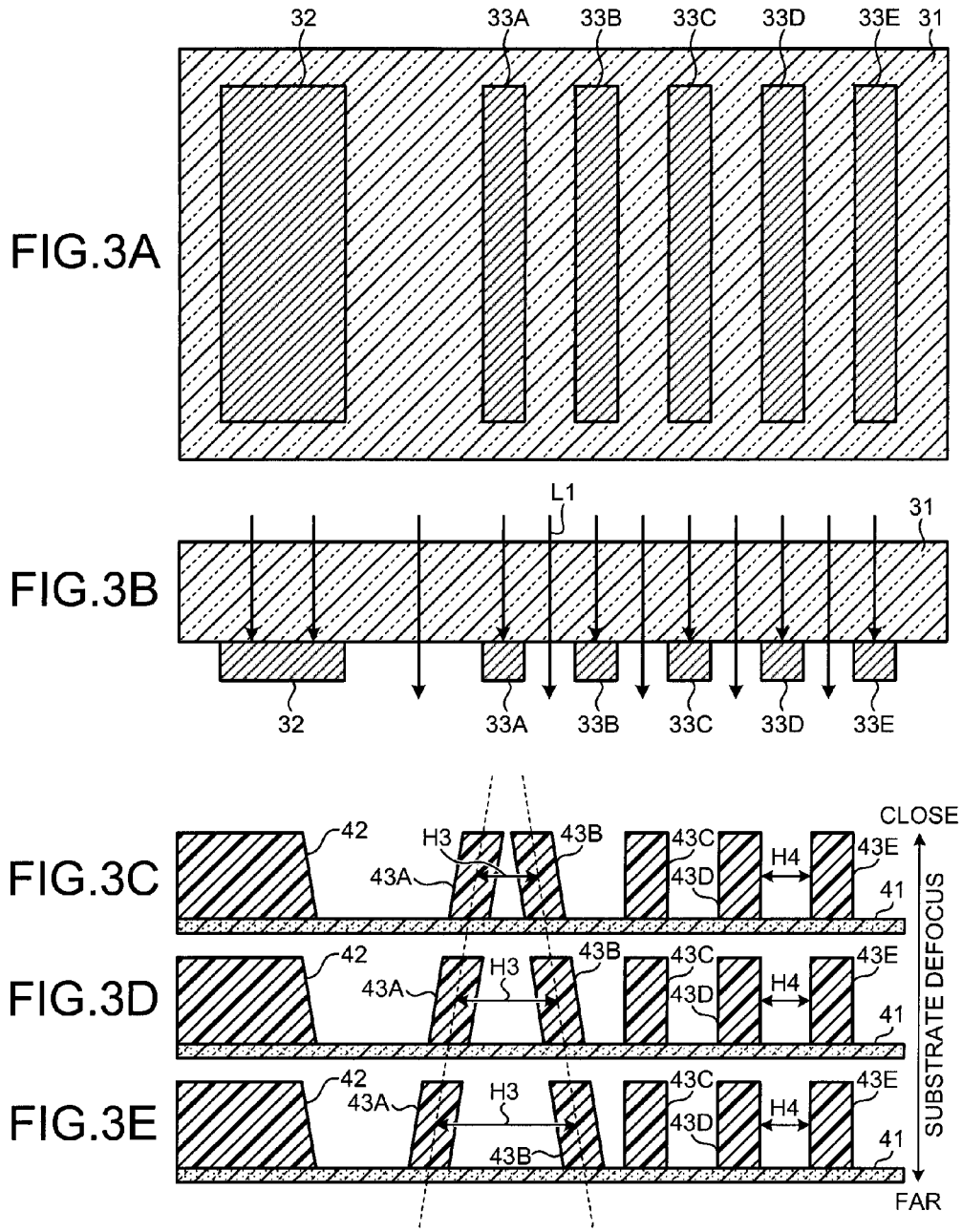

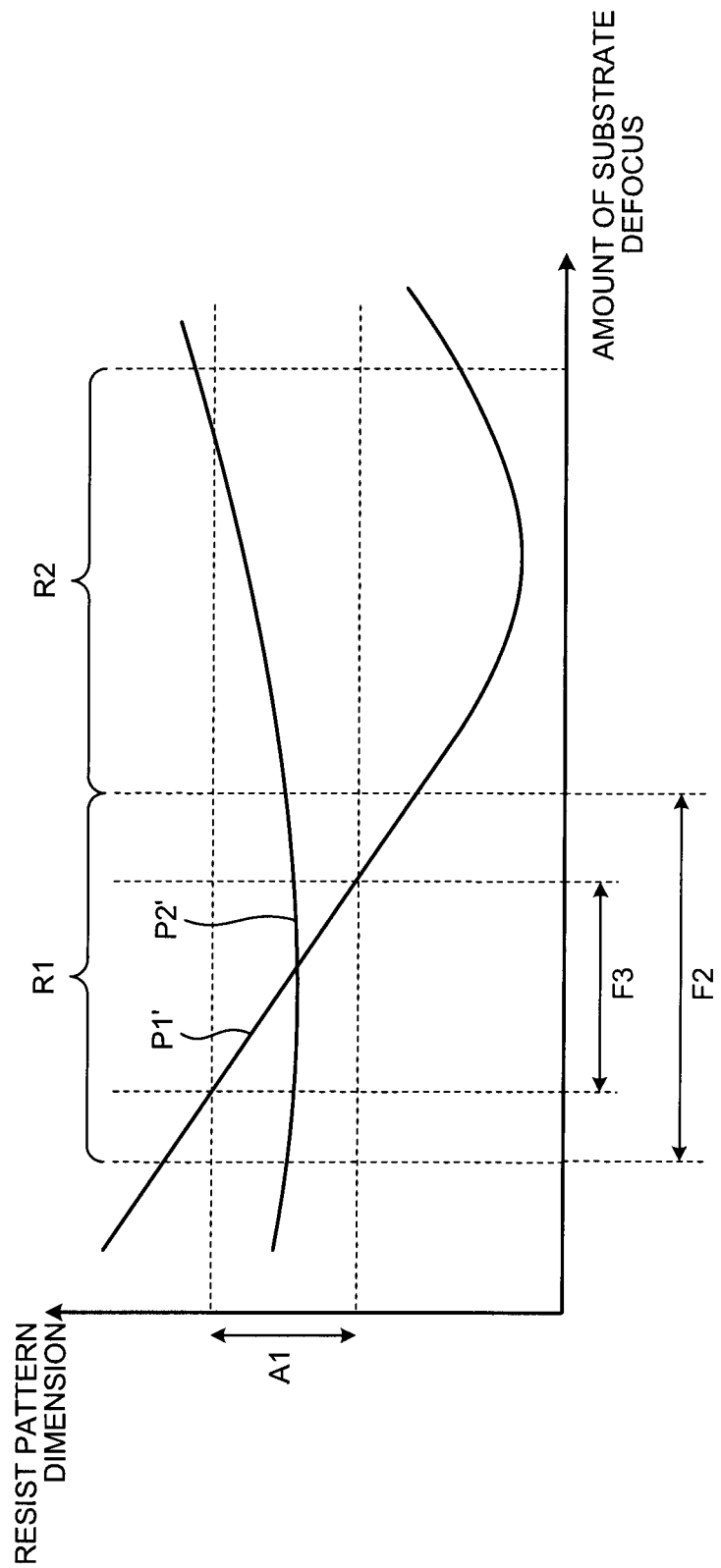

(a)   (b)

PHOTOMASK AND PATTERN FORMING METHOD

CROSS-REFERENCE TO RELATED APPLICATIONS

This application is based upon and claims the benefit of priority from Japanese Patent Application No. 2012-059983, filed on Mar. 16, 2012; the entire contents of which are incorporated herein by reference.

FIELD

Embodiments described herein relate generally to a photomask and a pattern forming method.

BACKGROUND

As the scaling of circuit patterns for semiconductor devices progresses, so does the scaling of mask patterns on photomasks. When the width of a mask pattern is reduced so that it is near the film thickness of the mask pattern, the focus position (best focus) at which the sensitivity to a focus shift is minimized becomes different depending on the shape of the mask pattern. Thus, it has become difficult to make the best focus uniform over the entire photomask, therefore, it has become difficult to reduce the dimension error of a resist pattern to fall within the allowable range over the entire pattern region of the photomask.

BRIEF DESCRIPTION OF THE DRAWINGS

FIG. 3A is a plan view illustrating a schematic configuration of a photomask in which the film thickness of light shielding patterns is constant, FIG. 3B is a cross-sectional view illustrating a schematic configuration of the photomask in FIG. 3A, and FIG. 3C to FIG. 3E are cross-sectional views illustrating schematic configurations of resist patterns formed when exposure is performed through the photomask in FIG. 3A;

FIG. 4 is a diagram illustrating the relationship between the dimension of a resist pattern formed when exposure is performed through the photomask in FIG. 3A and the amount of substrate defocus;

DETAILED DESCRIPTION

In general, according to one embodiment, a photomask includes a mask substrate transparent to light, a light shielding pattern formed on the mask substrate, and a thin film portion that is provided at a part of the light shielding pattern and is thinned to have a higher light transmittance than the light shielding pattern.

A photomask and a pattern forming method according to the embodiments will be explained below with reference to the drawings. The present invention is not limited to these embodiments.

(First Embodiment)

Figure 1A:
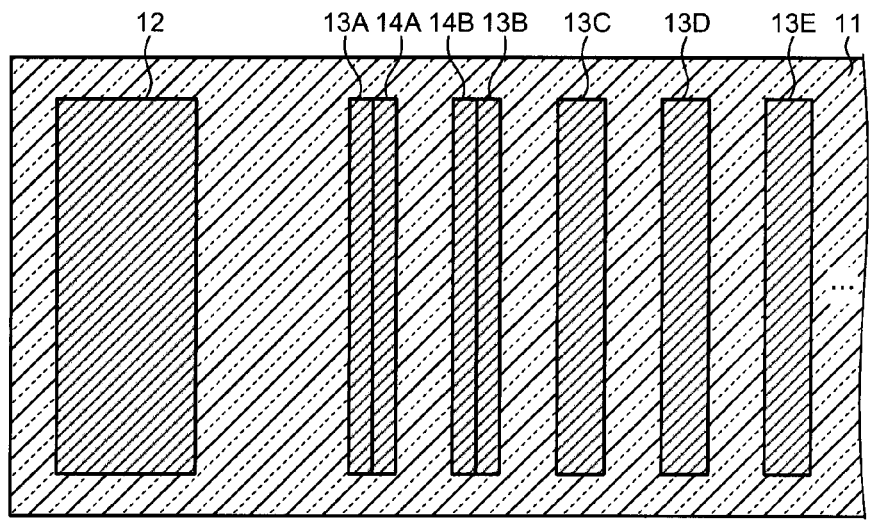
FIG. 1A is a plan view illustrating a schematic configuration of a photomask according to a first embodiment.
Figure 1B:
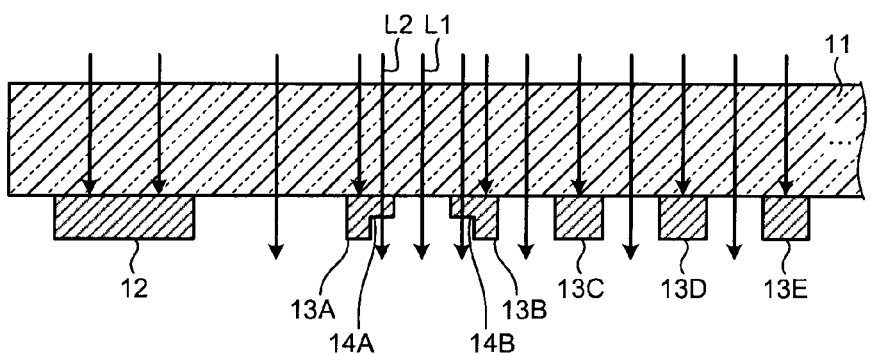
FIG. 1B is a cross-sectional view illustrating a schematic configuration of the photomask in FIG. 1A.
Figure 1C:
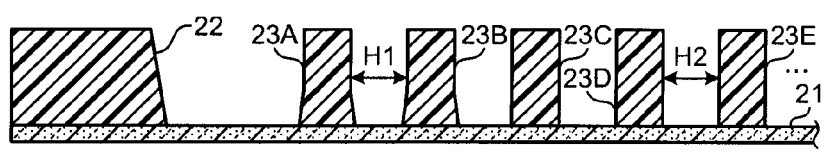
FIG. 1C is a cross-sectional view illustrating a schematic configuration of resist patterns formed when exposure is performed through the photomask in FIG. 1A.

FIG. 1A is a plan view illustrating a schematic configuration of a photomask according to the first embodiment, FIG. 1B is a cross-sectional view illustrating a schematic configuration of the photomask in FIG. 1A, and FIG. 1C is a cross-sectional view illustrating a schematic configuration of resist patterns formed when exposure is performed through the photomask in FIG. 1A.

In FIG. 1A and FIG. 1B, light shielding patterns 12 and 13A to 13E are formed on a mask substrate 11. For example, a transparent substrate, such as quartz, can be used as the material for the mask substrate 11 and MoSi, Cr, or the like can be used as the material for the light shielding patterns 12 and 13A to 13E. The light shielding patterns 13A to 13E can form a periodic pattern in which the line width and the line spacing are set periodically. Examples of this periodic pattern may include a line and space. Moreover, for example, the half pitch of this periodic pattern can be set to 160 nm. Moreover, the light shielding patterns 13A and 13B among the light shielding patterns 13A to 13E can form a periodic end pattern arranged in the end portion of the periodic pattern.

The light shielding patterns 13A and 13B are provided with thin film portions 14A and 14B that are thinned to have higher light transmittance than the light shielding patterns 13A and 13B. The thin film portions 14A and 14B can be arranged at the edges of the light shielding patterns 13A and 13B along the longitudinal direction of the light shielding patterns 13A and 13B. The film thickness of the thin film portions 14A and 14B is set such that the phase difference between transmitted light L1 that is transmitted through the photomask and partially-transmitted light L2 that is partially transmitted through the thin film portions 14A and 14B is made different from an integral multiple of 0 degrees and 180 degrees. Particularly, a large focus shift can occur when the phase difference is set to a value near 90 degrees. For example, the film thickness of the thin film portions 14A and 14B can be set to ½ of the film thickness of the light shielding patterns 13A and 13B. Specifically, if the half pitch of the light shielding patterns 13A to 13E is 160 nm, the material of the light shielding patterns 13A to 13E is MoSi, and the wavelength of the transmitted light L1 and the partially-transmitted light L2 is 193 nm, the film thickness of the light shielding patterns 13A to 13E can be set to 70 nm and the film thickness of the thin film portions 14A and 14B can be set to 35 nm. When the light shielding patterns 13A to 13E are a halftone phase shift mask formed of MoSi, the phase difference becomes approximately 90 degrees by setting the film thickness of the thin film portions 14A and 14B to ½. The film thickness of the light shielding patterns 12 and 13A to 13E does not necessarily need to be set to completely shield the light and may be set such that approximately a few percent of the light is transmitted therethrough.

Moreover, as a method of forming the thin film portions 14A and 14B, it is possible to use a method of selectively etching the light shielding patterns 13A and 13B. In this process, for example, an electron beam defect repair apparatus (MeRiT MG) manufactured by Carl Zeiss can be used. Moreover, the film thickness and the range of the thin film portions 14A and 14B may be determined by using a mask for setting exposure conditions or may be calculated by using exposure simulation. When exposure simulation is used, it is desirable to use what is called mask 3D model with which the electromagnetic field near the mask is accurately calculated while taking into consideration the three-dimensional structure of the mask. The film thickness and the range of the thin film portions 14A and 14B can be changed depending on the neighboring pattern layout shape, the material of a mask light shielding film, the illumination condition (illumination shape and NA of a projector lens), the state of residual aberration of a projector lens, and the like.

Figure 10:
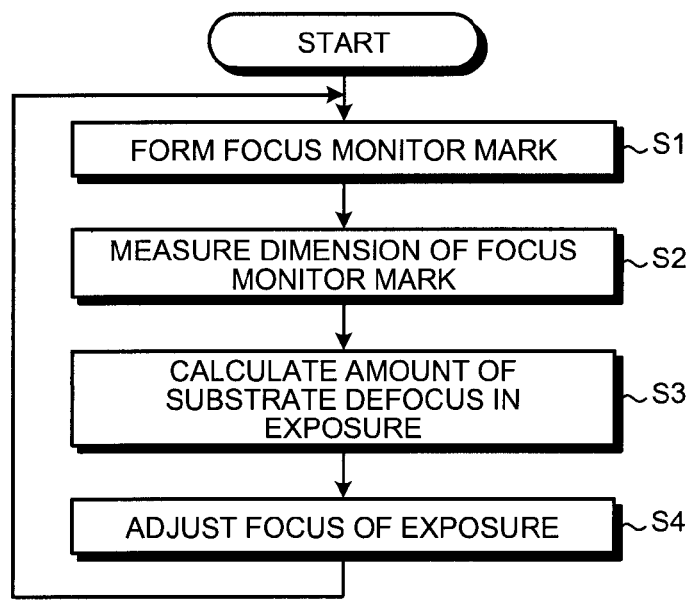
FIG. 10 is a flowchart illustrating a pattern forming method according to the third embodiment.

On the other hand, a resist film is formed on an underlying layer 21. The underlying layer 21 may be a semiconductor substrate, a dielectric layer formed on the semiconductor substrate, or the like, and is not specifically limited thereto. After the resist film is exposed through the photomask in FIG. 1A and FIG. 1B, the resist film is developed, whereby resist patterns 22 and 23A to 23E corresponding to the light shielding patterns 12 and 13A to 13E are formed on the underlying layer 21 as shown in FIG. 10. For this exposure, for example, an ArF immersion exposure apparatus whose NA is 1.35 and projection magnification is ¼ can be used.

The transmitted light L1 is regularly transmitted in the periodic pattern, however, a disturbance occurs in the regularity of the transmitted light L1 in the periodic end pattern. Under the condition that the width of the light shielding patterns 13A to 13E is approximately as fine as the film thickness of the light shielding patterns 13A to 13E, if there is a disturbance in the regularity of the transmitted light L1, the best focus shifts compared with a case where there is no disturbance.

When the light shielding patterns 13A and 13B are provided with the thin film portions 14A and 14B, the transmitted light L1 and the partially-transmitted light L2, whose phase is shifted, interfere with each other, therefore, the best focus in the periodic end pattern can be shifted. Therefore, the best focuses in the periodic pattern and in the periodic pattern can be made close to each other, enabling the dimension error of the resist patterns 23A to 23E to fall within the allowable range over the entire pattern region of the photomask.

Figure 2:
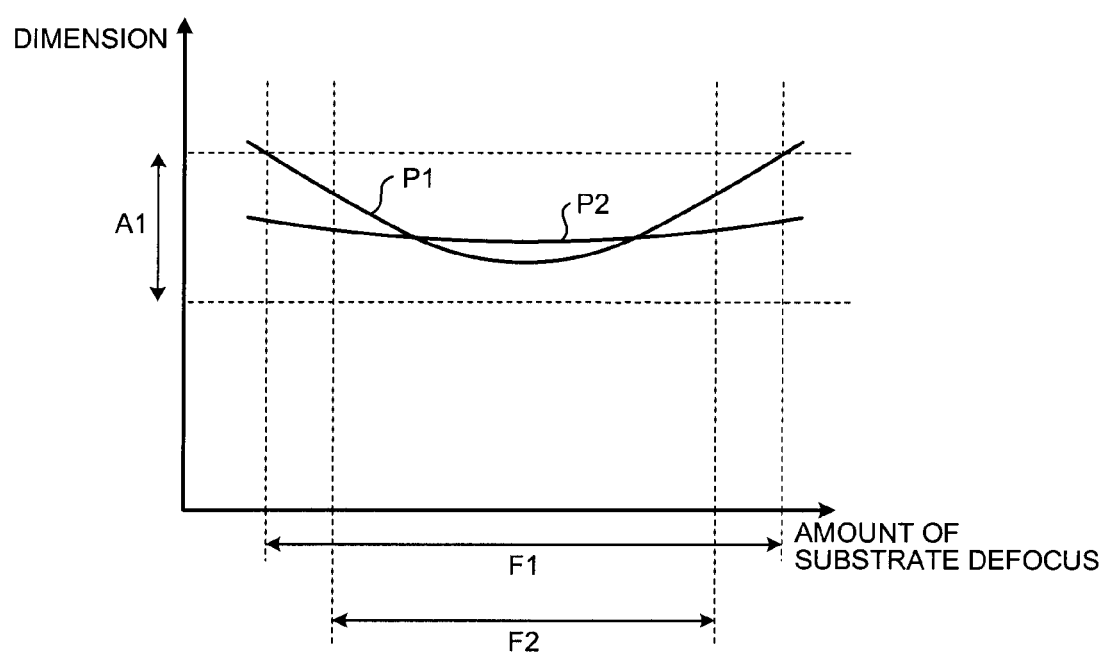
FIG. 2 is a diagram illustrating the relationship between the dimension of a resist pattern formed when exposure is performed through the photomask in FIG. 1A and the amount of substrate defocus.

FIG. 2 is a diagram illustrating the relationship between the dimension of a resist pattern formed when exposure is performed through the photomask in FIG. 1A and the amount of substrate defocus. In FIG. 2, P1 indicates a dimension H1 between the resist patterns 23A and 23B in FIG. 1C and P2 indicates a dimension H2 between adjacent resist patterns of the resist patterns 23C to 23E in FIG. 1C.

In FIG. 2, it is possible to match the focus range in which the sensitivity to a focus shift of the light shielding patterns 13A and 13B is stable with the focus range in which the sensitivity to a focus shift of the light shielding patterns 13C to 13E is stable by providing the light shielding patterns 13A and 13B with the thin film portions 14A and 14B. Thus, if the dimension error allowable range of the dimensions H1 and H2 is A1, the necessary focus accuracy becomes F1, therefore, the error of the dimensions H1 and H2 can fall within the error range determined by a focus control capability F2 of the exposure apparatus.

FIG. 3A is a plan view illustrating a schematic configuration of a photomask in which the film thickness of light shielding patterns is constant, FIG. 3B is a cross-sectional view illustrating a schematic configuration of the photomask in FIG. 3A, and FIG. 3C to FIG. 3E are cross-sectional views illustrating schematic configurations of resist patterns formed when exposure is performed through the photomask in FIG. 3A.

In FIG. 3A and FIG. 3B, light shielding patterns 32 and 33A to 33E are formed on a mask substrate 31. The photomask in FIG. 3A and FIG. 3B is the same as the photomask in FIG. 1A and FIG. 1B except that the film thickness of the light shielding patterns 32 and 33A to 33E is constant. The light shielding patterns 33A and 33B can form a periodic end pattern and the light shielding patterns 33C to 33E can form a periodic pattern.

Then, as shown in FIG. 3C to FIG. 3E, resist patterns 42 and 43A to 43E corresponding to the light shielding patterns 32 and 33A to 33E are formed on an underlying layer 41 by using the photomask in FIG. 3A and FIG. 3B. The exposure condition at this time is the same as the exposure condition when the resist patterns 22 and 23A to 23E in FIG. 1C are formed.

The transmitted light L1 is regularly transmitted in the periodic pattern, however, a disturbance occurs in the regularity of the transmitted light L1 in the periodic end pattern. Then, if there is a disturbance in the regularity of the transmitted light L1, the sensitivity of the resist dimension change to a focus shift becomes high compared with a case where there is no disturbance and the best focus shifts.

Therefore, as shown in FIG. 3C to FIG. 3E, although the dimension H4 between adjacent resist patterns of the resist patterns 43C to 43E does not substantially change due to occurrence of substrate defocus, the resist patterns 43A and 43B are tilted toward each other and the dimension H3 between the resist patterns 43A and 43B changes.

FIG. 4 is a diagram illustrating the relationship between the dimension of a resist pattern formed when exposure is performed through the photomask in FIG. 3A and the amount of substrate defocus. In FIG. 4, P1' indicates the dimension H3 between the resist patterns 43A and 43B in FIG. 3C to FIG. 3E and P2' indicates the dimension H4 between adjacent resist patterns of the resist patterns 43C to 43E in FIG. 3C to FIG. 3E.

In FIG. 4, when the light shielding patterns 33A and 33B are not provided with the thin film portions 14A and 14B, a focus range R2 in which the sensitivity to a focus shift of the light shielding patterns 33A and 33B is stable and a focus range R1 in which the sensitivity to a focus shift of the light shielding patterns 33C to 33E is stable are different from each other. At this time, the focus range R1 becomes sensitive to a focus shift of the light shielding patterns 33A and 33B. Thus, if the dimension error allowable range of the dimensions H3 and H4 is A1, the necessary focus accuracy in the dimension H3 becomes F3, therefore, the error of the dimension H3 cannot fall within the error range determined by the focus control capability F2 of the exposure apparatus.

When the light shielding patterns 33A and 33B are provided with the thin film portions 14A and 14B, it is possible to shift the focus range R2 in which the sensitivity to a focus shift of the light shielding patterns 33A and 33B is stable. Therefore, as shown in FIG. 2, the focus range R2 can be made to match the focus range R1, enabling the dimension error of the resist patterns to fall within the allowable range over the entire pattern region of the photomask.

The thin film portions 14A and 14B are preferably arranged along the inner edges of the light shielding patterns 33A and 33B when the resist patterns 43A and 43B tilt. The film thickness and the width of the thin film portions 14A and 14B may be adjusted in accordance with the tilt angle of the resist patterns 43A and 43B. Moreover, if the resist patterns 43C to 43E also tilt due to the exposure condition in addition to the resist patterns 43A and 43B, the light shielding patterns 33C to 33E may also be provided with a thin film portion.

Figure 5A:
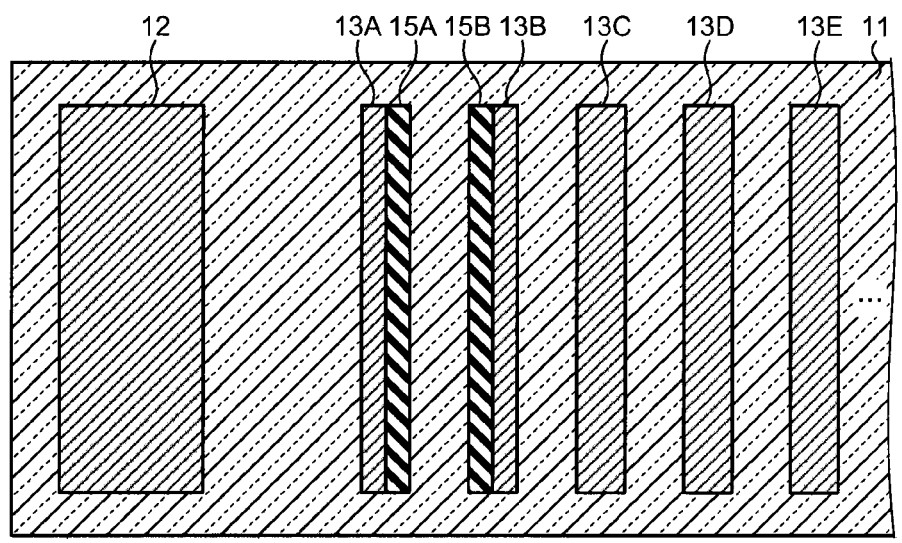
FIG. 5A is a plan view illustrating a modified example of the photomask according to the first embodiment and FIG. 5B is a cross-sectional view illustrating a schematic configuration of the photomask in FIG. 5A.
Figure 5B:
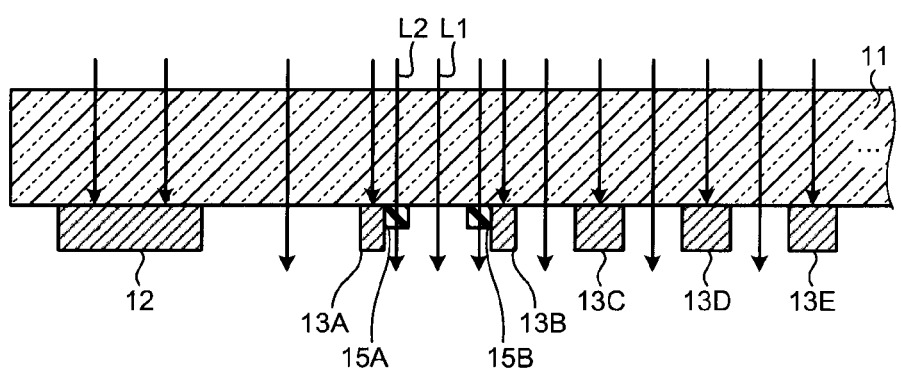

FIG. 5A is a plan view illustrating a modified example of the photomask according to the first embodiment and FIG. 5B is a cross-sectional view illustrating a schematic configuration of the photomask in FIG. 5A.

In FIG. 5A and FIG. 5B, a similar effect can be obtained by selectively depositing a film forming material instead of forming the thin film portions by selectively etching the light shielding patterns. In this process, for example, an electron beam defect repair apparatus (MeRiT MG) manufactured by Carl Zeiss can be used. The film forming material may be the same as or different from the light shielding pattern of the mask. For example, silicon dioxide ($SiO_2$) can be used. Moreover, in this case, the thickness of the film forming material may be thinner or thicker than the thickness of the mask light shielding portion as long as it is set such that the phase difference between the transmitted light L1 that is transmitted through the photomask and the transmitted light L2 that is transmitted or partially transmitted through thin film portions 15A and 15B is made different from an integral multiple of 0 degrees and 180 degrees.

(Second Embodiment)

Figure 6A:
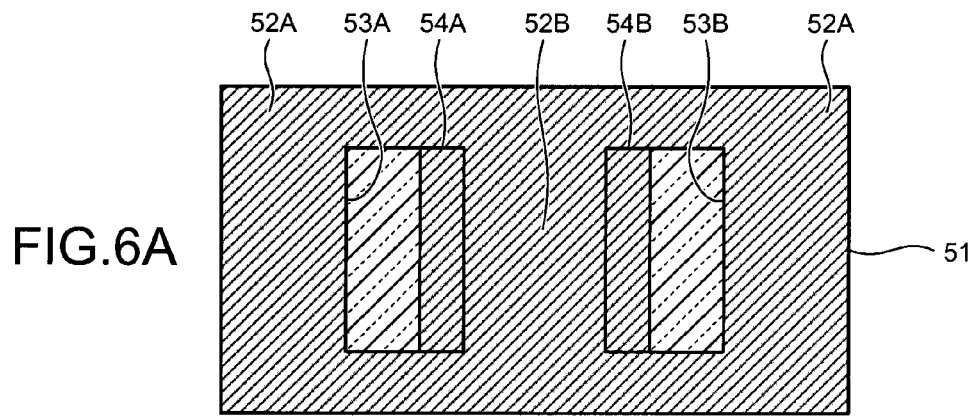
FIG. 6A is a plan view illustrating a schematic configuration of a photomask according to a second embodiment.
Figure 6B:
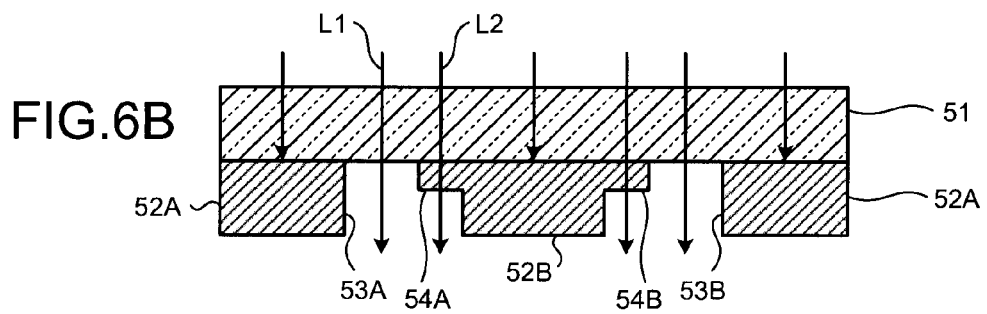
FIG. 6B is a cross-sectional view illustrating a schematic configuration of the photomask in FIG. 6A, and FIG. 6C to FIG. 6E are cross-sectional views illustrating schematic configurations of resist patterns formed when exposure is performed through the photomask in FIG. 6A.
Figure 6C:
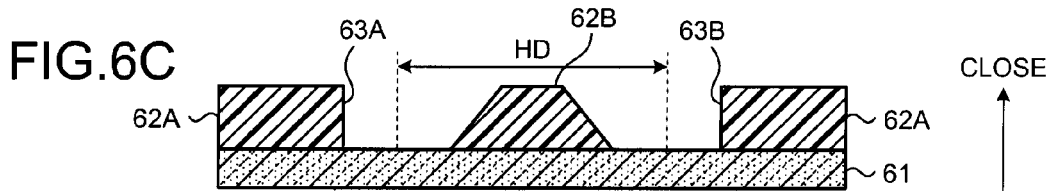
Figure 6D:
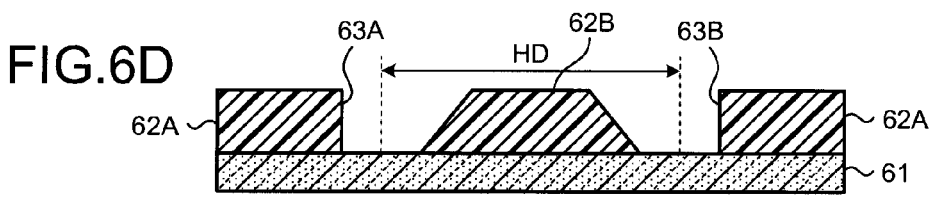
Figure 6E:
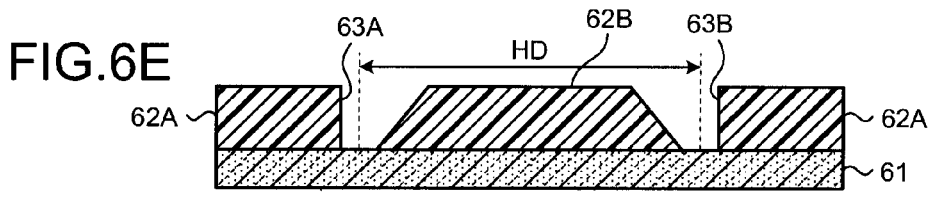
Figure 7:
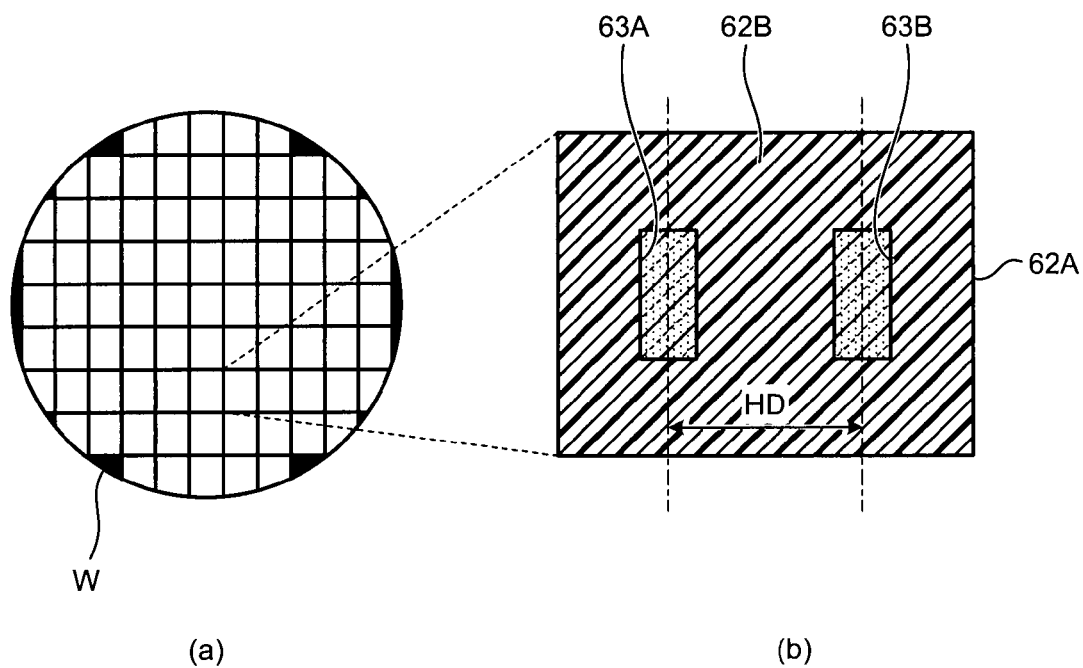
FIG. 7A is a plan view illustrating a schematic configuration of the entire wafer in which the resist patterns, which are formed when exposure is performed through the photomask in FIG. 6A, are arranged
FIG. 7B is a plan view illustrating part of the resist patterns formed on the wafer in FIG. 7A in an enlarged scale.

FIG. 6A is a plan view illustrating a schematic configuration of a photomask according to the second embodiment, FIG. 6B is a cross-sectional view illustrating a schematic configuration of the photomask in FIG. 6A, and FIG. 6C to FIG. 6E are cross-sectional views illustrating schematic configurations of resist patterns formed when exposure is performed through the photomask in FIG. 6A. FIG. 7A is a plan view illustrating a schematic configuration of the entire wafer in which the resist patterns, which are formed when exposure is performed through the photomask in FIG. 6A, are arranged and FIG. 7B is a plan view illustrating part of the resist patterns formed on the wafer in FIG. 7A in an enlarged scale.

In FIG. 6A and FIG. 6B, a light shielding pattern 52A is formed on a mask substrate 51. Then, opening patterns 53A and 53B are formed in the light shielding pattern 52A, thereby forming a light shielding pattern 52B between the opening patterns 53A and 53B. For example, a transparent substrate, such as quartz, can be used as the material for the mask substrate 51 and MoSi, Cr, or the like can be used as the material for the light shielding patterns 52A and 52B.

The light shielding pattern 52B is provided with thin film portions 54A and 54B that are thinned to have higher light transmittance than the light shielding pattern 52B. The thin film portions 54A and 54B can be arranged such that the light shielding pattern 52B becomes more sensitive to a focus shift than the light shielding pattern 52A. The thin film portions 54A and 54B can be arranged to face each other with the light shielding pattern 52B therebetween. The film thickness of the thin film portions 54A and 54B is set such that the phase difference between the transmitted light L1 that is transmitted through the photomask and the partially-transmitted light L2 that is partially transmitted through the thin film portions 54A and 54B is made different from an integral multiple of 0 degrees and 180 degrees. Particularly, a large focus shift can occur when the phase difference is set to a value near 90 degrees. For example, the film thickness of the thin film portions 54A and 54B can be set to ½ of the film thickness of the light shielding pattern 52B. The film thickness of the light shielding patterns 52A and 52B does not necessarily need to be set to completely shield the light and may be set such that approximately a few percent of the light is transmitted therethrough.

On the other hand, a resist film is formed on an underlying layer 61. The underlying layer 61 may be a semiconductor wafer W in FIG. 7A, a dielectric layer formed on the semiconductor wafer W, or the like, and is not specifically limited thereto. After the resist film is exposed through the photomask in FIG. 6A and FIG. 6B, the resist film is developed, whereby resist patterns 62A and 62B corresponding to the light shielding patterns 52A and 52B are formed on the underlying layer 61 as shown in FIG. 6C to FIG. 6E. As shown in FIG. 6C, opening patterns 63A and 63B are formed in the resist pattern 62A, whereby the resist pattern 62B is formed between the opening patterns 63A and 63B.

In the light shielding pattern 52A in which the opening patterns 53A and 53B are formed, the focus range is set to the focus range in which the sensitivity to a focus shift is stable. At this time, if the light shielding pattern 52B is provided with the thin film portions 54A and 54B, in the light shielding pattern 52B, the focus range shifts to the focus range that is sensitive to a focus shift. Therefore, if defocus of the wafer occurs, although the position of the edge of the resist pattern 62A does not substantially change, the edge of the resist pattern 62B changes and a center-to-center distance HD of the opening patterns 63A and 63B changes.

Figure 8:
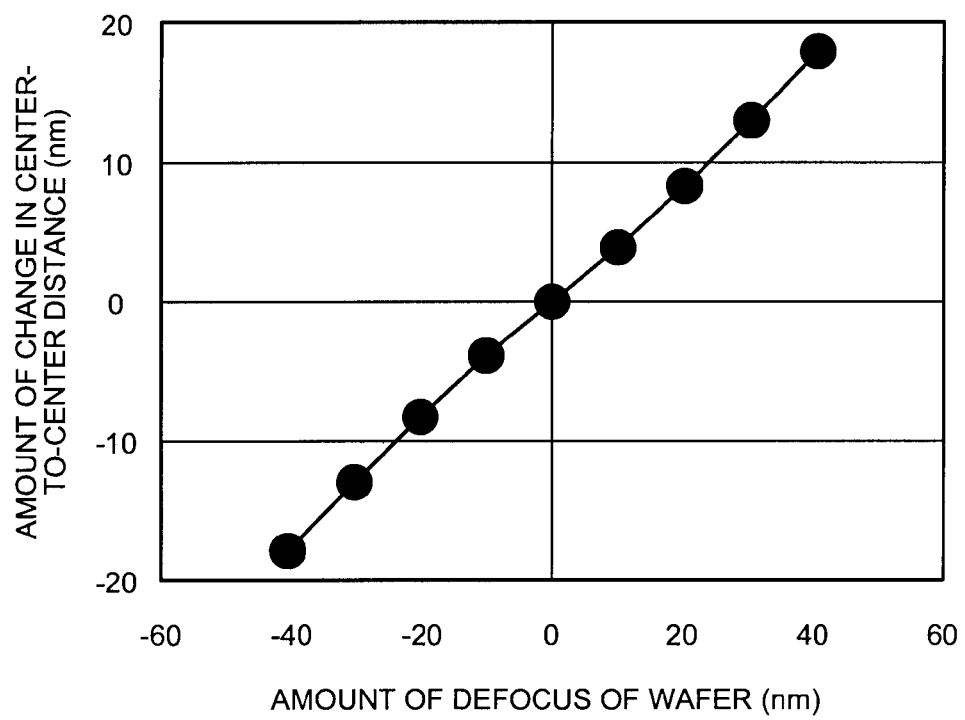
FIG. 8 is a diagram illustrating the relationship between the center-to-center distance of opening patterns formed in the resist pattern when exposure is performed through the photomask in FIG. 6A and substrate defocus.

FIG. 8 is a diagram illustrating the relationship between the center-to-center distance of the opening patterns formed in the resist pattern when exposure is performed through the photomask in FIG. 6A and defocus of the wafer.

In FIG. 8, it is found that the amount of change of the center-to-center distance HD of the opening patterns 63A and 63B is substantially proportional to defocus of the wafer. Therefore, the amount of defocus (magnitude and direction) of the wafer can be obtained by measuring the center-to-center distance HD of the opening patterns 63A and 63B. The center-to-center distance HD may be measured by using an optical measurement instrument or may be measured by using a scanning electron microscope (SEM). When the amount of defocus of the wafer is obtained, the exposure condition is adjusted so that the amount of defocus of the wafer approaches zero, therefore the dimension accuracy of the resist patterns can be improved in the subsequent wafer exposure. If the center-to-center distance HD is measured at a plurality of locations on the semiconductor wafer W and is converted into the amount of defocus of the wafer, a focus map of the entire surface of the semiconductor wafer W can be generated.

In the focus control of the exposure apparatus, the surface shape of the wafer is measured by using autofocus light and the position and posture of a wafer stage are controlled based on the measurement result to set the height of the wafer to the best focus surface of a projector lens. At this time, the focus accuracy is deteriorated because of the change of the best focus surface of the projector lens due to the change in temperature and atmospheric pressure, the focus correction residue due to irregularities on the wafer surface, the focus illusion due to the reflectance distribution in the layer lower than the resist layer of the wafer, and the like. In order to improve the focus accuracy, it is effective to obtain the focus map of the actually exposed wafer and feed back the focus map to the wafer stage control of the exposure apparatus in addition to improving the exposure apparatus. In order to obtain this focus map, a pattern (focus monitor mark) sensitive to the amount of defocus of the wafer needs to be transferred onto the wafer. Furthermore, it is desirable to use the focus monitor mark with which the direction of focus (for example, direction in which the wafer approaches the projector lens is plus and direction in which the wafer is away from the projector lens is minus) can be recognized. The photomask in FIG. 6A and FIG. 6B can be used for generating such a focus monitor mark. This focus monitor mark may be generated as a TEG pattern on a scribe line of the wafer W or the like.

Figure 9A:
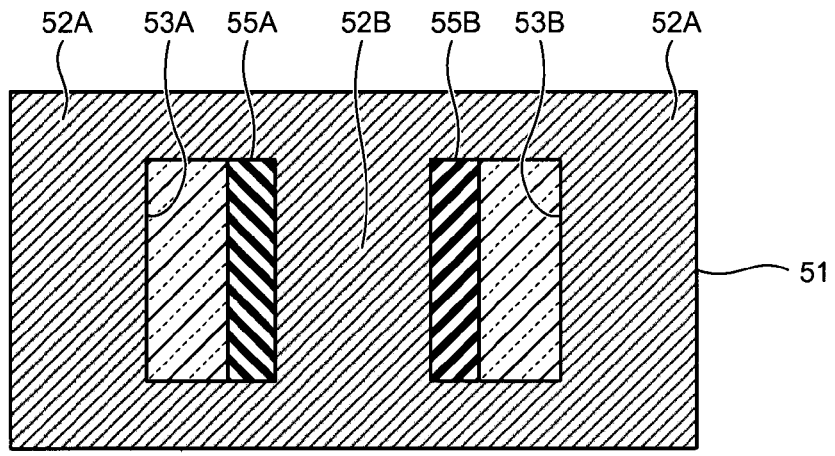
FIG. 9A is a plan view illustrating a modified example of the photomask according to the second embodiment and FIG. 9B is a cross-sectional view illustrating a schematic configuration of the photomask in FIG. 9A.
Figure 9B:
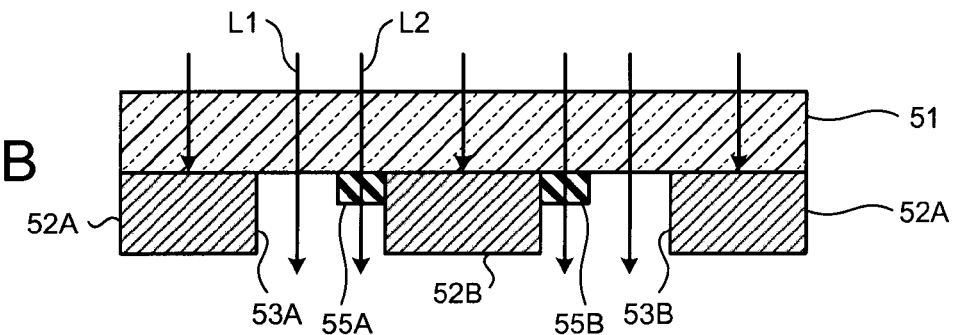

FIG. 9A is a plan view illustrating a modified example of the photomask according to the second embodiment and FIG. 9B is a cross-sectional view illustrating a schematic configuration of the photomask in FIG. 9A.

In FIG. 9A and FIG. 9B, a similar effect can be obtained by selectively depositing a film forming material instead of forming the thin film portions by selectively edging the light shielding pattern. The film forming material may be the same as or different from that of the light shielding pattern of the mask. For example, silicon dioxide ($SiO_2$) can be used. Moreover, in this case, the thickness of the film forming material may be thinner or thicker than the thickness of the mask light shielding portion as long as it is set such that the phase difference between the transmitted light L1 that is transmitted through the photomask and the transmitted light L2 that is transmitted or partially transmitted through deposited portions 55A and 55B is made different from an integral multiple of 0 degrees and 180 degrees.

(Third Embodiment)

FIG. 10 is a flowchart illustrating a pattern forming method according to the third embodiment. In FIG. 10, resist patterns used as a focus monitor mark are formed on the wafer by using the photomask in FIG. 6A and FIG. 6B (S1). Next, the dimension of this focus monitor mark is measured (S2). Then, the amount of defocus of the wafer is obtained based on this dimension measurement result (S3). At this time, for example, the amount of defocus of the wafer can be obtained by referring to the relationship in FIG. 8. Next, focus of exposure is adjusted based on this amount of defocus (S4).

(Fourth Embodiment)

Figure 11:
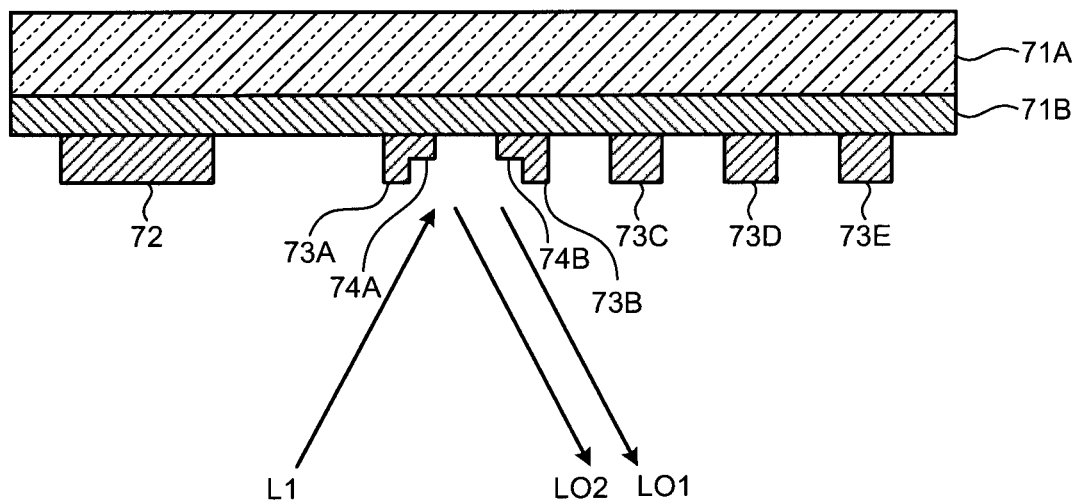
FIG. 11 is a cross-sectional view illustrating a schematic configuration of a photomask according to the fourth embodiment.

FIG. 11 is a cross-sectional view illustrating a schematic configuration of a photomask according to the fourth embodiment.

In FIG. 11, a multilayer reflective film 71B is formed on a mask substrate 71A. Light absorbing patterns 72 and 73A to 73E are formed on the multilayer reflective film 71B. For example, a substrate, such as quartz, can be used as the material for the mask substrate 71A, a stacked structure of Mo and Si can be used as the material for the multilayer reflective film 71B, and oxide, such as TaBO, or nitride, such as TaBN, can be used as the material for the light absorbing patterns 72 and 73A to 73E. The light absorbing pattern 73A to 73E can form a periodic pattern in which the line width and the line spacing are set periodically, and examples of this periodic pattern may include a line and space. Moreover, the light absorbing patterns 73A and 73B among the light absorbing pattern 73A to 73E can form a periodic end pattern arranged in the end portion of the periodic pattern.

The light absorbing patterns 73A and 73B are provided with thin film portions 74A and 74B that are thinned to have higher reflectance than the light absorbing patterns 73A and 73B. The thin film portions 74A and 74B can be arranged at the edges of the light absorbing patterns 73A and 73B along the longitudinal direction of the light absorbing patterns 73A and 73B. The film thickness of the thin film portions 74A and 74B is set such that the phase difference between reflected light LO1 reflected from the photomask with respect to incident light LI and partially-reflected light LO2 partially reflected from the thin film portions 74A and 74B is made different from an integral multiple of 0 degrees and 180 degrees. Particularly, a large focus shift can occur when the phase difference is set to a value near 90 degrees. For example, the film thickness of the thin film portions 74A and 74B can be set to ½ of the film thickness of the light absorbing patterns 73A and 73B. The film thickness of the light absorbing patterns 72 and 73A to 73E does not necessarily need to be set to completely absorb the light and may be set such that approximately a few percent of the light is reflected. Moreover, as the incident light LI, for example, extreme ultraviolet light with a wavelength of 13.5 nm can be used.

The reflected light LO1 regularly reflects in the periodic pattern, however, a disturbance occurs in the regularity of the reflected light LO1 in the periodic end pattern. Then, if there is a disturbance in the regularity of the reflected light LO1, the sensitivity to a focus shift increases compared with a case where there is no disturbance and the best focus shifts.

When the light absorbing patterns 73A and 73B are provided with the thin film portions 74A and 74B, the partially-reflected light LO2 can interfere with the reflected light LO1, therefore, it is possible to shift the focus position at which the sensitivity to a focus shift of the periodic end pattern is stable. Therefore, the focus positions, at which the sensitivity to a focus shift is stable, can be made close to each other in the periodic pattern and the periodic end pattern, enabling the dimension error of the resist patterns to fall within the allowable range over the entire pattern region of the photomask.

In the example in FIG. 11, explanation is given for the method of providing the thin film portions 74A and 74B thinned to have higher reflectance than the light absorbing patterns 73A and 73B as an adjusting portion adjusted to have a lower optical absorptance than the light absorbing patterns 73A and 73B, however, a material having a lower optical absorptance than the light absorbing patterns 73A and 73B may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A photomask for forming a resist pattern, comprising:
   a mask substrate transparent to light, a surface of the mask substrate being flat;
   a light shielding pattern formed on the surface of the mask substrate; and having first and second parts; and a correction portion that is provided at the first light shielding pattern part and that has a higher light transmittance than the light shielding pattern.

2. The photomask according to claim 1, wherein the correction portion includes a different material than the light shielding pattern or has a smaller thickness than the light shielding pattern.

3. The photomask according to claim 2, wherein
the first and second shielding pattern respectively corresponding to first and second parts of the resist pattern, the first resist pattern part having a higher sensitivity to focus shift than the second resist pattern part; and
the correction portion is associated only with the first light shielding pattern part.

4. The photomask according to claim 2, wherein the material or the thickness of the correction portion is set such that a phase difference between a transmitted light that is transmitted through the mask substrate and a partially-transmitted light that is partially transmitted through the correction portion is different from 0 degrees and is different from an integral multiple of 180 degrees.

5. The photomask according to claim 4, wherein the thickness of the correction portion is ½ of a film thickness of the light shielding pattern.

6. The photomask according to claim 1, wherein the correction portion is arranged along an edge of the light shielding pattern.

7. The photomask according to claim 3, wherein
the second light shielding pattern part is a periodic pattern in which a line width and a line spacing are set periodically, and
the first light shielding pattern part is a periodic end pattern arranged in an end portion of the periodic pattern.

8. The photomask according to claim 7, wherein the correction portion is arranged along an edge of the periodic end pattern.

9. The photomask according to claim 3, wherein the correction portion is provided such that a focus range in which a sensitivity to a focus shift of the first light shielding pattern is stable matches a focus range in which a sensitivity to a focus shift of the second light shielding pattern part is stable.

10. The photomask according to claim 1, further comprising:
a first opening provided in the light shielding pattern; and
a second opening that is provided in the light shielding pattern and that is arranged adjacent to the first opening, wherein the correction portion is arranged along mutually facing edges of the first opening and the second opening.

11. The photomask according to claim 1, wherein the correction portion is arranged such that a projection image of the first light shielding pattern part is more sensitive to a focus shift than a projection image of the second light shielding pattern part.

12. A photomask for forming a resist pattern, comprising:
a mask substrate, a surface of the mask substrate being flat;
a reflective film formed on the surface of the mask substrate;
a light absorbing pattern formed on the reflective film and having first and second parts; and
a correction portion that is provided at the first light absorbing pattern part and that is adjusted to have a lower optical absorptance than the light absorbing pattern.

13. The photomask according to claim 12, wherein the correction portion includes a different material than the light shielding pattern or has a smaller thickness than light absorbing pattern.

14. The photomask according to claim 13, wherein
the first and second shielding pattern parts respectively correspond to first and second parts of the resist pattern, the first resist pattern part having a higher sensitivity to focus shift than the second resist pattern part; and
the correction portion is associated only with the first light absorbing pattern part.

15. The photomask according to claim 13, wherein the material or the thickness of the correction portion is set such that a phase difference between a reflected light that is reflected from the mask substrate and a partially-reflected light that is partially reflected from the correction portion is different from 0 degrees and is different from an integral multiple of 180 degrees.

16. The photomask according to claim 13, wherein the correction portion is arranged along an edge of the light absorbing pattern.

17. A pattern forming method comprising:
forming a resist film on an underlying layer;
exposing the resist film through a photomask including:
a mask substrate transparent to light, a surface of the mask substrate being flat;
a light shielding pattern formed on the surface of the mask substrate and having first and second parts; and
a correction portion that is provided at the first light shielding pattern part and that has a higher light transmittance than the light shielding pattern; and
forming a resist pattern on the underlying layer by developing the resist film.

18. The pattern forming method according to claim 17, wherein the correction portion includes a different material than the light shielding pattern or has a smaller thickness than the light shielding pattern.

19. The pattern forming method according to claim 18, wherein
the first and second shielding pattern respectively correspond to first and second parts of the resist pattern, the first resist pattern part having a higher sensitivity to focus shift than the second resist pattern part; and
the correction portion is associated only with the first light shielding pattern part.

* * * * *